US008860750B2

(12) United States Patent
Tripathi et al.

(10) Patent No.: US 8,860,750 B2
(45) Date of Patent: Oct. 14, 2014

(54) DEVICES AND METHODS FOR DYNAMIC DITHERING

(75) Inventors: Brijesh Tripathi, San Jose, CA (US); Michael Frank, Sunnyvale, CA (US)

(73) Assignee: Apple Inc., Cupertino, CA (US)

( * ) Notice: Subject to any disclaimer, the term of this patent is extended or adjusted under 35 U.S.C. 154(b) by 861 days.

(21) Appl. No.: 13/043,183

(22) Filed: Mar. 8, 2011

(65) Prior Publication Data

US 2012/0229497 A1 Sep. 13, 2012

(51) Int. Cl.

| | |
|---|---|
| ***G09G 5/00*** | (2006.01) |
| ***G09G 5/02*** | (2006.01) |
| ***G06K 9/40*** | (2006.01) |
| ***H03L 7/00*** | (2006.01) |
| ***H04N 7/00*** | (2011.01) |
| ***H03M 1/12*** | (2006.01) |
| ***H04N 1/46*** | (2006.01) |
| ***G06K 15/00*** | (2006.01) |
| ***G06K 9/38*** | (2006.01) |
| ***G06K 9/60*** | (2006.01) |
| ***G09G 3/20*** | (2006.01) |

(52) U.S. Cl.

CPC ............ *G09G 3/2037* (2013.01); *G09G 3/2066* (2013.01); *G09G 3/2051* (2013.01); *G09G 2320/0266* (2013.01)

USPC ........... 345/596; 345/581; 345/600; 345/606; 345/616; 348/547; 348/552; 348/574; 358/3.03; 358/3.13; 358/534; 382/270; 382/276; 382/300

(58) Field of Classification Search

USPC ................. 345/581, 596, 600, 606, 616, 636; 348/426.1, 435, 441, 466, 469, 478, 348/500, 513, 547, 552, 571, 574; 358/1.9, 358/3.03, 3.05, 3.13, 3.14, 530, 534; 382/252, 254, 270, 274, 276, 299–300

See application file for complete search history.

(56) References Cited

U.S. PATENT DOCUMENTS

| | | | | |
|---|---|---|---|---|
| 5,170,152 | A * | 12/1992 | Taylor | 345/605 |
| 7,184,053 | B2 * | 2/2007 | Correa et al. | 345/589 |
| 7,268,790 | B1 * | 9/2007 | Small et al. | 345/596 |
| 7,420,571 | B2 | 9/2008 | Lee et al. | |
| 7,542,620 | B1 * | 6/2009 | Bilbrey et al. | 382/268 |
| 2002/0008885 | A1 | 1/2002 | Lin et al. | |
| 2003/0142878 | A1 * | 7/2003 | Willis et al. | 382/269 |
| 2003/0218778 | A1 | 11/2003 | Ohta | |
| 2004/0174463 | A1 * | 9/2004 | Long | 348/624 |
| 2005/0210338 | A1 * | 9/2005 | Young | 714/57 |
| 2006/0215227 | A1 * | 9/2006 | Kakutani | 358/3.01 |
| 2009/0225234 | A1 * | 9/2009 | Ward et al. | 348/744 |
| 2011/0025591 | A1 * | 2/2011 | Han et al. | 345/102 |
| 2011/0122450 | A1 * | 5/2011 | Puckett | 358/3.06 |
| 2011/0135218 | A1 * | 6/2011 | Moore | 382/275 |
| 2012/0120096 | A1 * | 5/2012 | Johnson et al. | 345/596 |

* cited by examiner

*Primary Examiner* — Wesner Sajous

(74) *Attorney, Agent, or Firm* — Fletcher Yoder PC

(57) ABSTRACT

Devices and methods for dynamic dithering are provided. For example, an electronic device according to an embodiment may include image processing circuitry that operates on higher-bit-depth image data and a display panel that displays lower-bit-depth image data. To obtain the lower-bit-depth image data, the image processing circuitry may perform dynamic dithering on the higher-bit-depth image data. Such dynamic dithering may involve dithering frames of the higher-bit-depth image data based at least in part on respective rounding threshold values.

22 Claims, 8 Drawing Sheets

DEVICES AND METHODS FOR DYNAMIC DITHERING

BACKGROUND

The present disclosure relates generally to processing of image data for an electronic display and, more particularly, to dynamic dithering.

This section is intended to introduce the reader to various aspects of art that may be related to various aspects of the present techniques, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

Many electronic displays, particularly those associated with portable electronic devices, may provide a relatively lower bit-depth than may be used internally by an associated electronic device. For example, an electronic device may operate on image data of 10 bits, but its associated electronic display may only be capable of displaying image data of 6 bits. To obtain lower-bit-depth image data from higher-bit-depth image data, an electronic device typically may not simply discard the least significant bits of the relatively higher-bit-depth image data, as doing so could result in a loss of image information. Instead, the electronic device may use dithering to obtain lower-bit-depth image data, as dithering may conserve the information contained in the least significant bits by distributing this information to other nearby pixels during image processing.

Generally speaking, dithered image data may be pleasing to the eye and may represent a good approximation of the original higher bit-depth image data. Indeed, when certain dithering techniques (e.g., Floyd-Steinberg dithering) are used on certain image data (e.g., photographic images or noisy image data), the resulting dithered image data may be difficult to distinguish from the original higher bit-depth image data. However, when these dithering techniques are employed with certain other image data (e.g., non-noisy or relatively uniform image data), the resulting dithered image data may sometimes contain unsightly artifacts, which may appear like grains of sand in the dithered image.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

Embodiments of the present disclosure relate to dynamic dithering. In particular, performing purely spatial dithering, such as Floyd-Steinberg dithering, may sometimes produce a lower-bit-depth image with unsightly artifacts. Dynamic dithering, as disclosed herein, may be used to make such artifacts essentially invisible to the human eye. Such dynamic dithering may involve periodically varying a rounding threshold value used by a dithering component of an electronic device. This rounding threshold value may represent a threshold value against which certain least significant bits (e.g., bits 0-4 of 10-bit image data that is being reduced to 6 bits) that are removed during dithering may be tested. The remaining most significant bits may be rounded up or down depending on whether the least significant bits that have been removed are greater than, equal to, or less than the rounding threshold value.

By varying the rounding threshold value periodically (e.g., for each frame of image data), the dithering component of the electronic device may output a slightly different frame of dithered image data each time the rounding threshold value changes, even if the input image data remains the same. As such, any artifacts in one location of the output dithered image data at one moment may, at the next moment, be in a different location or even be gone altogether. As a result, image artifacts may not remain in place for too many successive frames displayed on the electronic display, becoming essentially invisible to most users.

By way of example, an electronic device according to an embodiment may include image processing circuitry that operates on higher-bit-depth image data and a display panel that displays lower-bit-depth image data. To obtain the lower-bit-depth image data, the image processing circuitry may perform dynamic dithering on the higher-bit-depth image data. Such dynamic dithering may involve dithering frames of the higher-bit-depth image data based at least in part on respective rounding threshold values.

Various refinements of the features noted above may exist in relation to various aspects of the present disclosure. Further features may also be incorporated in these various aspects as well. These refinements and additional features may exist individually or in any combination. For instance, various features discussed below in relation to one or more of the illustrated embodiments may be incorporated into any of the above-described aspects of the present disclosure alone or in any combination. The brief summary presented above is intended only to familiarize the reader with certain aspects and contexts of embodiments of the present disclosure without limitation to the claimed subject matter.

BRIEF DESCRIPTION OF THE DRAWINGS

Various aspects of this disclosure may be better understood upon reading the following detailed description and upon reference to the drawings in which.

DETAILED DESCRIPTION OF SPECIFIC EMBODIMENTS

Figure 1:
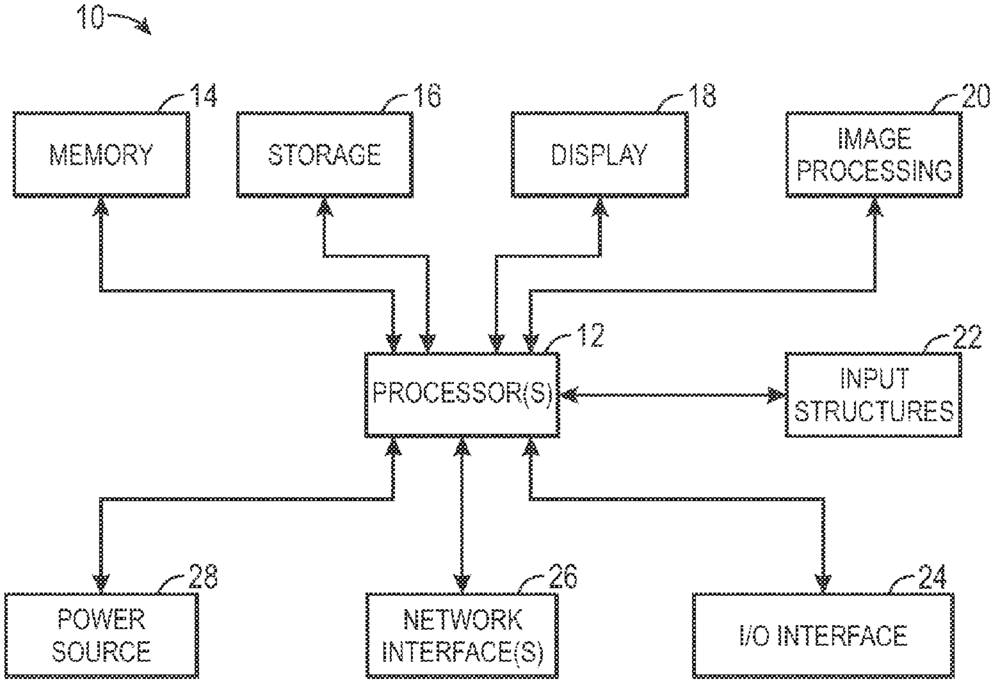
FIG. 1 is a schematic block diagram of an electronic device capable of performing the dynamic dithering techniques described herein.

One or more specific embodiments of the present disclosure will be described below. These described embodiments are only examples of the presently disclosed techniques. Additionally, in an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features.

As mentioned above, electronic devices often may operate on relatively higher bit-depth image data (e.g., 8-10 bits), but electronic displays used by such electronic devices may only be capable of displaying a lower bit-depth (e.g., 6-8 bits). Since merely discarding the least significant bits of the pixels of image data could result in a loss of image information, an electronic device may perform a dithering technique (e.g., Floyd-Steinberg) to obtain lower-bit-depth image data. Such a dithering technique may preserve much of the image information of the higher-bit-depth image data by distributing the difference (i.e., an error signal) between lower bit-depth pixels that have been rounded up or down and the original higher-bit-depth image data of one pixel to other nearby pixels.

Performing spatial dithering, such as Floyd-Steinberg dithering, may sometimes produce a lower-bit-depth image with unsightly artifacts. As such, present embodiments relate to dynamic dithering that may be used to make such artifacts essentially invisible to the human eye. As disclosed herein, dynamic dithering may involve periodically varying a rounding threshold value used by a dithering component of an electronic device. This rounding threshold value may represent a threshold value against which certain least significant bits (e.g., bits 0-4 of 10-bit image data that is being reduced to 6 bits) that are removed during dithering may be tested. The remaining most significant bits may be rounded up or down depending on whether the least significant bits that have been removed are greater than, equal to, or less than the rounding threshold value.

By varying the rounding threshold value periodically (e.g., for each frame of image data), the dithering component of the electronic device may output a slightly different frame of dithered image data each time the rounding threshold value changes, even if the input image data remains the same. As such, any artifacts in one location of the output dithered image data at one moment may, at the next moment, be in a different location or even be gone altogether. As a result, image artifacts may not remain in place for too many successive frames displayed on the electronic display, becoming essentially invisible to most users. This form of dithering, in which the rounding threshold value is periodically varied, is generally referred to herein as "dynamic dithering."

Figure 2:
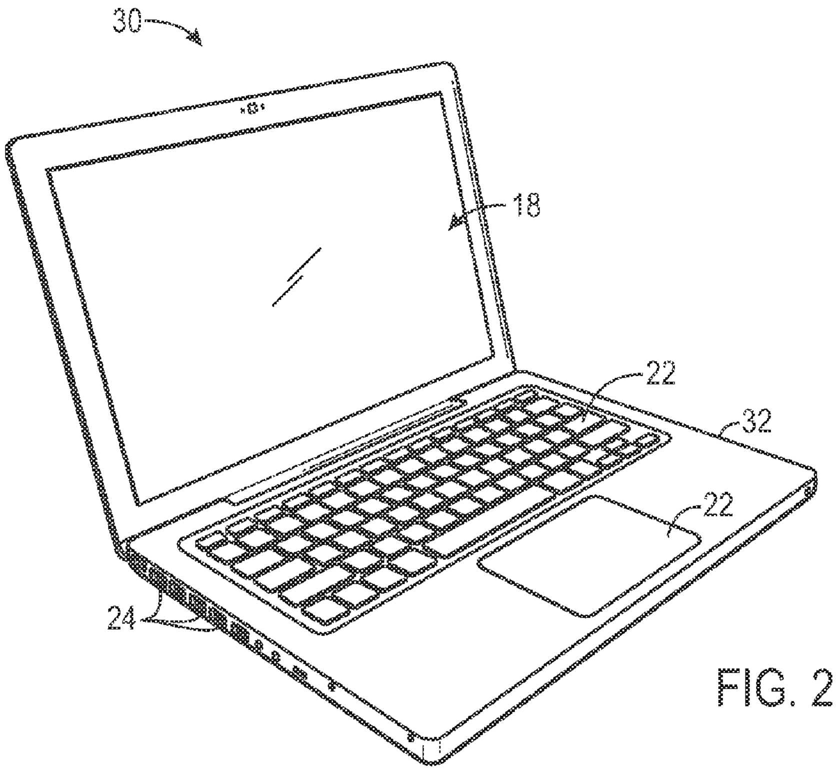
FIG. 2 is a perspective view of a notebook computer, which represents one embodiment of the electronic device of FIG. 1.
Figure 3:
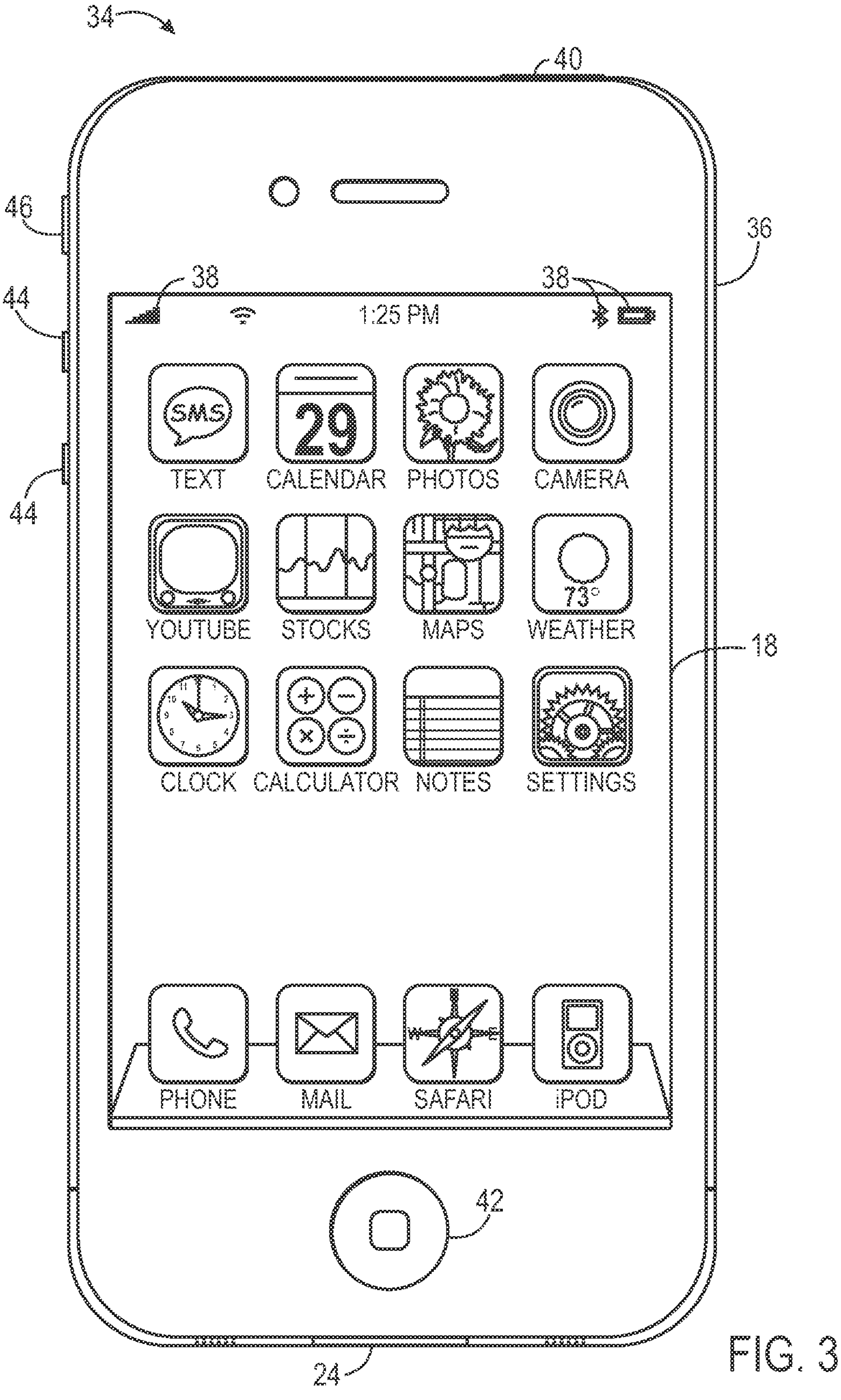
FIG. 3 is a front view of a handheld device, which represents another embodiment of the electronic device of FIG. 1.

With the foregoing in mind, a general description of suitable electronic devices for performing the presently disclosed dynamic dithering techniques is provided below. In particular, FIG. 1 is a block diagram depicting various components that may be present in an electronic device suitable for use with the present techniques. FIGS. 2 and 3 respectively illustrate perspective and front views of suitable electronic device, which may be, as illustrated, a notebook computer or a handheld electronic device having the dynamic dithering capabilities described herein.

Turning first to FIG. 1, an electronic device 10 for performing the presently disclosed techniques may include, among other things, one or more processor(s) 12, memory 14, nonvolatile storage 16, a display 18, an image processing component 20, input structures 22, an input/output (I/O) interface 24, network interfaces 26, and a power source 28. The various functional blocks shown in FIG. 1 may include hardware elements (including circuitry), software elements (including computer code stored on a computer-readable medium) or a combination of both hardware and software elements. It should be noted that FIG. 1 is merely one example of a particular implementation and is intended to illustrate the types of components that may be present in electronic device 10.

By way of example, the electronic device 10 may represent a block diagram of the notebook computer depicted in FIG. 2, the handheld device depicted in FIG. 3, or similar devices. It should be noted that the image processing component 20, the processor(s) 12 and/or other data processing circuitry may be generally referred to herein as "data processing circuitry." Such data processing circuitry may be embodied wholly or in part as software, firmware, hardware, or any combination thereof. Furthermore, the data processing circuitry may be a single contained processing module or may be incorporated wholly or partially within any of the other elements within the electronic device 10.

In the electronic device 10 of FIG. 1, the processor(s) 12 and/or other data processing circuitry may be operably coupled with the memory 14 and the nonvolatile memory 16 to perform various algorithms for carrying out the presently disclosed techniques. Such programs or instructions executed by the processor(s) 12 may be stored in any suitable article of manufacture that includes one or more tangible, computer-readable media at least collectively storing the instructions or routines, such as the memory 14 and the nonvolatile storage 16. The memory 14 and the nonvolatile storage 16 may include any suitable articles of manufacture for storing data and executable instructions, such as random-access memory, read-only memory, rewritable flash memory, hard drives, and optical discs. Also, programs (e.g., an operating system) encoded on such a computer program product may also include instructions that may be executed by the processor(s) 12 to enable the electronic device 10 to provide various functionalities, including those described herein.

The display 18 may be a touch-screen display, which may enable users to interact with a user interface of the electronic device 10. The display 18 may be any suitable type of display, such as a liquid crystal display (LCD), plasma display, a digital light processing (DLP) projector, an organic light emitting diode (OLED) display, and so forth. In general, the display 18 may display image data of a relatively lower bit-depth than is generally operated on by the data processing circuitry (e.g., the processor(s) 12 or the image processing component 20) of the electronic device 10. By way of example, the processor(s) 12 may operate on 8- or 10-bit image data, and the display 18 may display 6- or 8-bit image data. In at least one embodiment of the electronic device 10, the processor(s) 12 may operate on 10-bit image data and the display 18 may be capable of displaying 6-bit image data.

Because the display 18 may display image data of a relatively lower bit-depth (e.g., 6 bits) than generally operated on by the data processing circuitry of the electronic device 10 (e.g., 10 bits), the image processing component 20 may reduce the bit-depth of such image data from the relatively higher bit-depth to the relatively lower bit-depth for display on the display 18. It should be noted that the image processing component 20 may represent a hardware image processing pipeline or instructions running on the processor(s) 12, or some combination of both. Because simply discarding the least significant bits of the higher-bit-depth image data to obtain lower-bit-depth image data could result in a perceptible loss of image information, the image processing component 20 may dither the higher-bit-depth image data to obtain the lower-bit-depth image data. The image processing component 20 may employ any suitable dithering algorithm, including, for example, Floyd-Steinberg dithering. As will be discussed further below, such dithering may involve removing some least significant bits of pixels of the higher-bit-depth image data (e.g., the lowest 4 bits of 10) and rounding the remaining value represented by the most significant bits (e.g., the highest 6 bits of 10) up or down, depending on whether the least significant bits that were removed are less than, equal to, or greater than a rounding threshold value, to produce lower bit-depth pixel data for display on the display 18. Thereafter, the difference between the original image data and the rounded image data may be distributed to other nearby pixels. By spreading the information from the least significant bits that were removed to other pixels, more of the information of the higher-bit-depth image data may be conserved, and the resulting lower-bit-depth image data may be more faithful to the original higher-bit-depth image data than if the least significant bits were simply discarded.

It should be noted that dithering the higher-bit-depth image data to produce lower-bit-depth image data for display on the display 18 may sometimes produce unsightly artifacts. These artifacts may appear, for example, like grains of sand in the resulting lower-bit-depth image data. If the rounding threshold value were to remain the same for some number of consecutive identical frames of image data, the artifacts may remain in the same place on the display 18 where a user may notice them. To prevent such artifacts from appearing in the same place for an extended period of time when multiple consecutive identical frames of image data are dithered, the rounding threshold value periodically may be varied. In some embodiments, the rounding threshold value may be varied on a frame-by-frame basis, though other periodic changes are envisaged (e.g., every other frame, every third frame, every fourth frame, and so forth, or every half second, every second, and so forth). The image processing component 20 may dither the higher-bit-depth image data into lower-bit-depth image data in a slightly different way each time the rounding threshold value is changed. Thus, by varying the rounding threshold value used by the image processing component 20 while dithering, unsightly artifacts in the resulting lower-bit-depth image data may be less likely to appear in the same location for an extended period of time.

The input structures 22 of the electronic device 10 may enable a user to interact with the electronic device 10 (e.g., pressing a button to initiate an image capture sequence). The I/O interface 24 may enable electronic device 10 to interface with various other electronic devices, as may the network interfaces 26. The network interfaces 26 may include, for example, interfaces for a personal area network (PAN), such as a Bluetooth network, for a local area network (LAN), such as an 802.11x Wi-Fi network, and/or for a wide area network (WAN), such as a 3G cellular network. The power source 28 of the electronic device 10 may be any suitable source of power, such as a rechargeable lithium polymer (Li-poly) battery and/or an alternating current (AC) power converter.

The electronic device 10 may take the form of a computer or other type of electronic device. Such computers may include computers that are generally portable (such as laptop, notebook, and tablet computers) as well as computers that are generally used in one place (such as conventional desktop computers, workstations and/or servers). In certain embodiments, the electronic device 10 in the form of a computer may be a model of a MacBook®, MacBook® Pro, MacBook Air®, iMac®, Mac® mini, or Mac Pro® available from Apple Inc. By way of example, the electronic device 10, taking the form of a notebook computer 30, is illustrated in FIG. 2 in accordance with one embodiment of the present disclosure. The depicted computer 30 may include a housing 32, a display 18, input structures 22, and ports of an I/O interface 24. In one embodiment, the input structures 22 (such as a keyboard and/or touchpad) may be used to interact with the computer 30, such as to start, control, or operate a GUI or applications running on computer 30. For example, a keyboard and/or touchpad may allow a user to navigate a user interface or application interface displayed on display 18. As noted above, the display 18 may display relatively lower-bit-depth image data than generally operated on by the computer 30. Because the computer 30 may dither higher-bit-depth image data to obtain such lower-bit-depth image data, periodically varying the rounding threshold value used in dithering, the image data displayed on the display 18 may appear largely free of unsightly image processing artifacts.

FIG. 3 depicts a front view of a handheld device 34, which represents one embodiment of the electronic device 10. The handheld device 34 may represent, for example, a portable phone, a media player, a personal data organizer, a handheld game platform, or any combination of such devices. By way of example, the handheld device 34 may be a model of an iPod® or iPhone® available from Apple Inc. of Cupertino, Calif. In other embodiments, the handheld device 34 may be a tablet-sized embodiment of the electronic device 10, which may be, for example, a model of an iPad® available from Apple Inc.

The handheld device 34 may include an enclosure 36 to protect interior components from physical damage and to shield them from electromagnetic interference. The enclosure 36 may surround the display 18, which may display indicator icons 38. The indicator icons 38 may indicate, among other things, a cellular signal strength, Bluetooth connection, and/or battery life. The I/O interfaces 24 may open through the enclosure 36 and may include, for example, a proprietary I/O port from Apple Inc. to connect to external devices.

User input structures 40, 42, 44, and 46, in combination with the display 18, may allow a user to control the handheld device 34. For example, the input structure 40 may activate or deactivate the handheld device 34, the input structure 42 may navigate user interface 20 to a home screen, a user-configurable application screen, and/or activate a voice-recognition feature of the handheld device 34, the input structures 44 may provide volume control, and the input structure 46 may toggle between vibrate and ring modes. As mentioned above, the display 18 may display relatively lower-bit-depth image data (e.g., 6 bits) than generally operated on by the handheld device 34 (e.g., 8 or 10 bits). Because the handheld device 34 may dither higher-bit-depth image data to obtain such lower-bit-depth image data, periodically varying the rounding threshold value used in dithering, the image data displayed on the display 18 may appear largely free of unsightly image processing artifacts.

Figure 4:
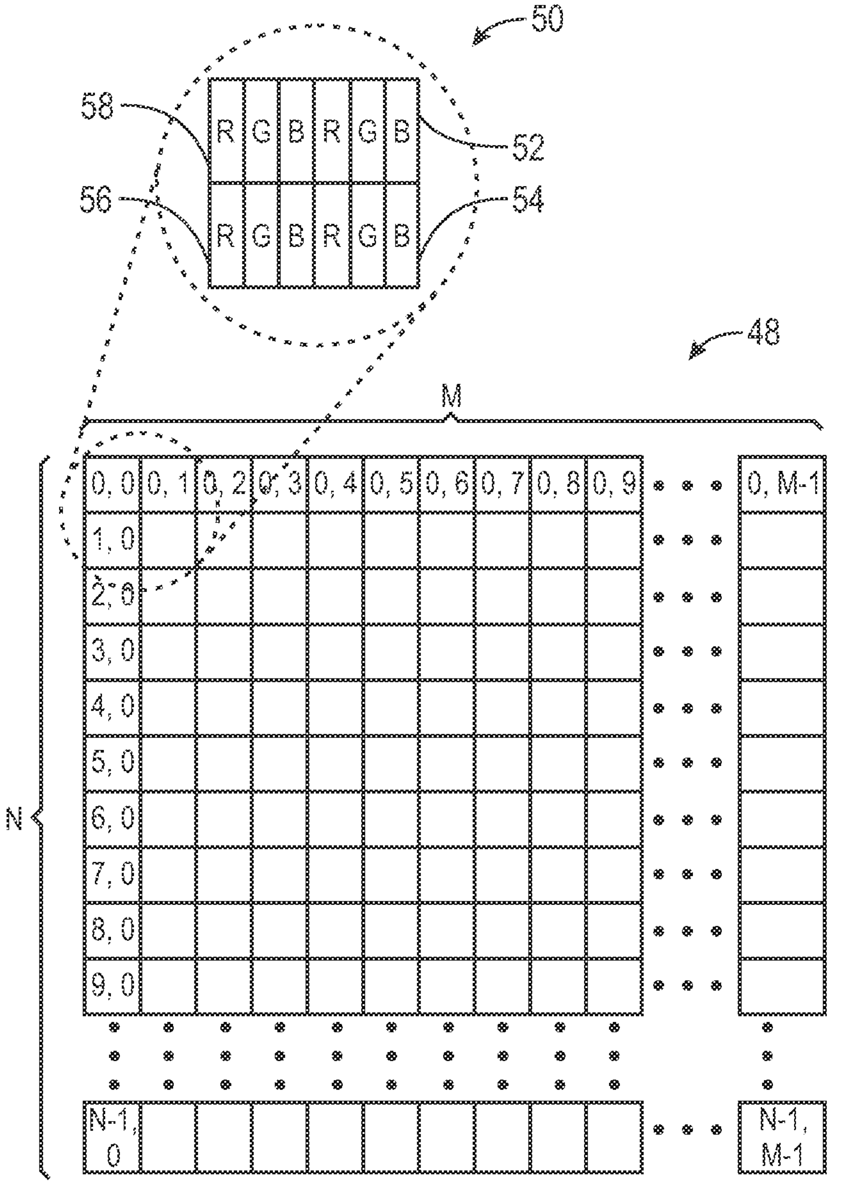
FIG. 4 is a schematic block diagram of an M×N pixel array, in accordance with an embodiment.

Having provided some context with regard to various forms that the electronic device 10 may take and now turning to FIG. 4, the present discussion will focus on details of the display 18 and on the image processing component 20. As mentioned above, the display 18 may be any suitable type of display, such as a liquid crystal display (LCD), plasma display, a digital light processing (DLP) projector, an organic light emitting diode (OLED) display, and so forth. The display 18 may include a matrix of pixel elements such as an example M×N array of pixels 48 depicted in FIG. 4. Accordingly, the display 18 is capable of presenting an image at a natural display resolution of M×N. For example, in embodiments where the display 18 is included in a 30 inch Apple Cinema HD Display®, the natural display resolution may be approximately 2560×1600 pixels. In embodiments in which the display 18 forms a component of a tablet computer such as iPad®, the natural display resolution of the display 18 may be approximately 1024×768 pixels.

A pixel group 50 is depicted in greater detail and includes four adjacent pixels 52, 54, 56, and 58. In the depicted embodiment, each pixel of the display 18 may include three sub-pixels capable of displaying a red (R), a green (G), and a blue (B) color. The human eye is capable of perceiving a particular RGB color combination and translating the combination into a certain color. By varying the individual RGB intensity levels, a number of colors may be displayed by each individual pixel. For example, a pixel having a level of 50% R, 50% G, and 50% B may be perceived colored gray, while a pixel having a level of 100% R, 100% G, and 0% B may be perceived as colored yellow.

The number of colors that a pixel is capable of displaying is dependent on the hardware capabilities of the display 18. For example, a display 18 with a 6-bit color depth for each sub-pixel is capable of producing 64 ($2^6$) intensity levels for each of the R, G, and B color components. The number of bits per sub-pixel, e.g. 6 bits, is referred to as the pixel depth. At a pixel depth of 6 bits, 262,144 ($2^6 \times 2^6 \times 2^6$) color combinations are possible, while at pixel depth of 8 bits, 16,777,216 ($2^8 \times 2^8 \times 2^8$) color combinations are possible. Although the visual quality of images produced by an 8-bit pixel depth display 18 may be superior to the visual quality of images produced by a display 18 using 6-bit pixel depth, the cost of the 8-bit display 18 is also higher. Accordingly, it would be beneficial to apply imaging processing techniques, such as the techniques described herein, to reduce the bit-depth of a source image to produce a lower bit-depth output image that faithfully represents the original higher bit-depth source image when using a lower pixel depth display 18. Accordingly, it would also be beneficial to apply imaging processing techniques that are capable of improved visual representation of any number of colors.

Figure 5:
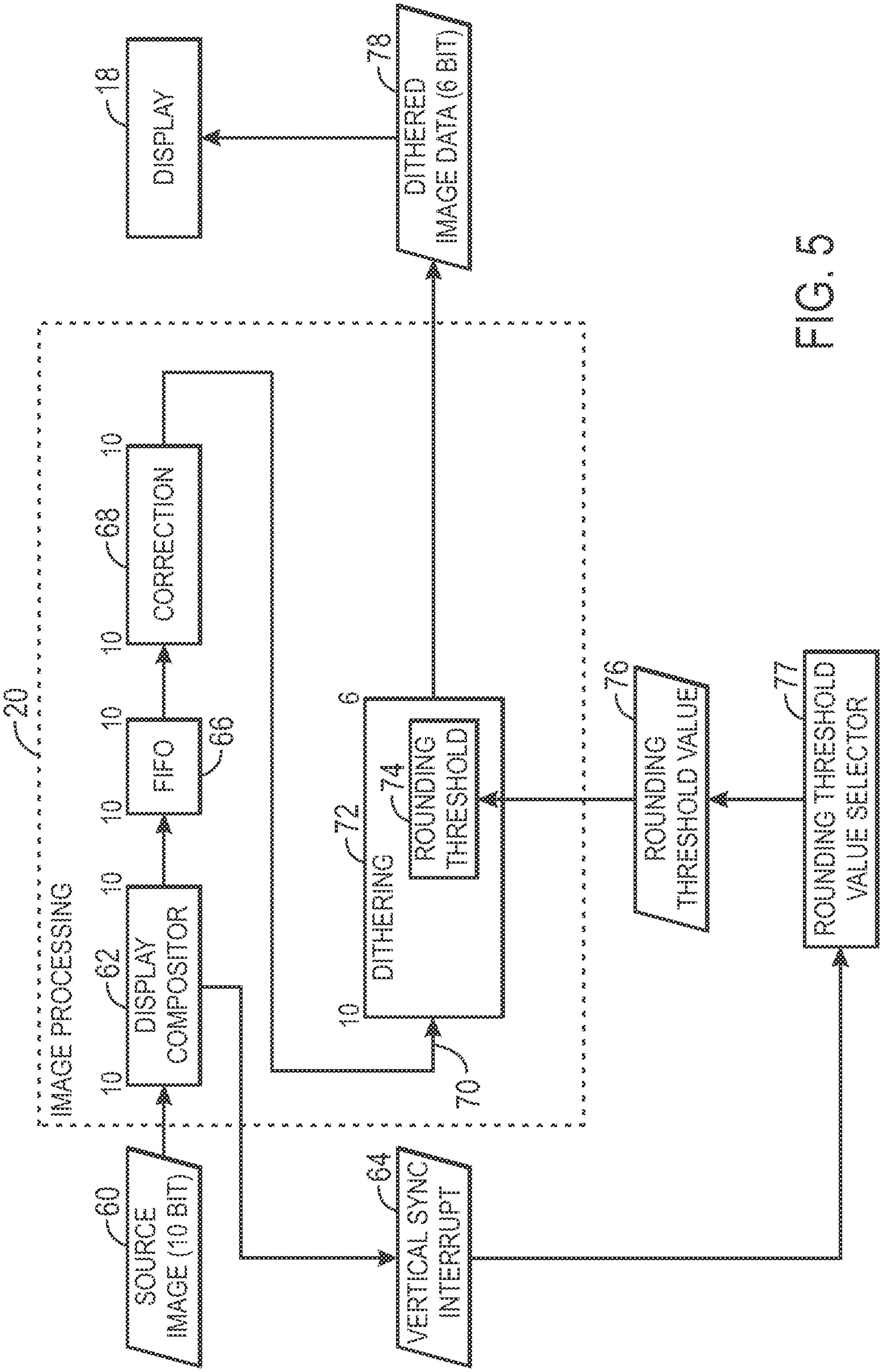
FIG. 5 is a schematic block diagram of an image processing component capable of dynamic dithering, in accordance with an embodiment.

The image processing component 20 of the electronic device 10 may perform dynamic dithering on such an N×M array of pixels 48 of higher-bit-depth image data (e.g., 10-bit image data) to obtain lower-bit-depth image data (e.g., 6-bit image data) that can be displayed on the display 18. For example, as shown in FIG. 5, the image processing component 20 of the electronic device 10 may receive source image data 60, representing a frame of higher-bit-depth image data, into a display compositor 62. When the display compositor 62 receives the source image data 60, the display compositor 62 may output a vertical sync interrupt 64 to indicate that the image processing component 20 is now processing a new frame of source image data 60. The display compositor 62 may output a stream of pixels to a first-in-first-out (FIFO) buffer 66. The stream of pixels may exit the FIFO buffer 66 and enter a correction component 68 of the image processing component 20. Such a correction component 68 may operate on the stream of image data from the FIFO buffer 66 in any suitable number of ways. For example, the correction component 68 may vary the image data depending on a backlight brightness, and/or may offer a system correction particular to the display 18 hardware that is being used (e.g., a manufacturer or display 18-specific correction). The operations performed on the stream of image data by the correction block 68 may or may not add additional bit-depth to such pixel data.

Before being output to the display 18, the corrected image data may be input data 70 for processing by a dithering component 72. As represented in the example of FIG. 5, the input image data enters the dithering component 72 at a relatively higher bit-depth (e.g., 10 bits) but will be dithered down to a lower bit-depth (e.g., 6 bits). The dithering component 72 of the image processing component 20 may employ a rounding threshold component 74 that is determined by a rounding threshold value 76. In the example of FIG. 5, a rounding threshold value selector component 77 that may be external to the image processing component 20 may provide a new rounding threshold value 76 to the rounding threshold component 74 of the image processing component 20 upon receipt of a vertical sync interrupt 64. By way of example, the rounding threshold value selector component 77 may represent instructions running on the processor(s) 12 (e.g., a component of a driver or firmware associated with the image processing component 20, a component of other software, and/or a component of an operating system of the electronic device 10). In other embodiments, the rounding threshold value selector component 77 may be embodied wholly or in part within the image processing component 20, which may represent, for example, a hardware image processing pipeline or instructions running on the processor(s) 12, or some combination of both.

As will be discussed below, the rounding threshold value 76 may be varied from time to time. Doing so may prevent unsightly artifacts from appearing in one place in output dithered image data 78 for any noticeable period of time. In one example, the rounding threshold value 76 may be changed every frame based on the vertical sync interrupt 64. However, the rounding threshold value 76 may be varied at other times, such as every other frame, every third frame, every fourth frame, and so forth. As will be discussed further below, the rounding threshold component 74 may be used by the dithering block 72 to alter the operation of the dithering performed on the input image data 70. Thus, when the dithering components 72 outputs dithered image data 78 of a relatively lower bit-depth (e.g., 6 bits) for display on the display 18, even if the subsequent frames of source image data 60 do not change, the dithered image data 78 may vary slightly so that any unsightly image artifacts in the dithered image data 78 will not remain in the same location every time.

Figure 6:
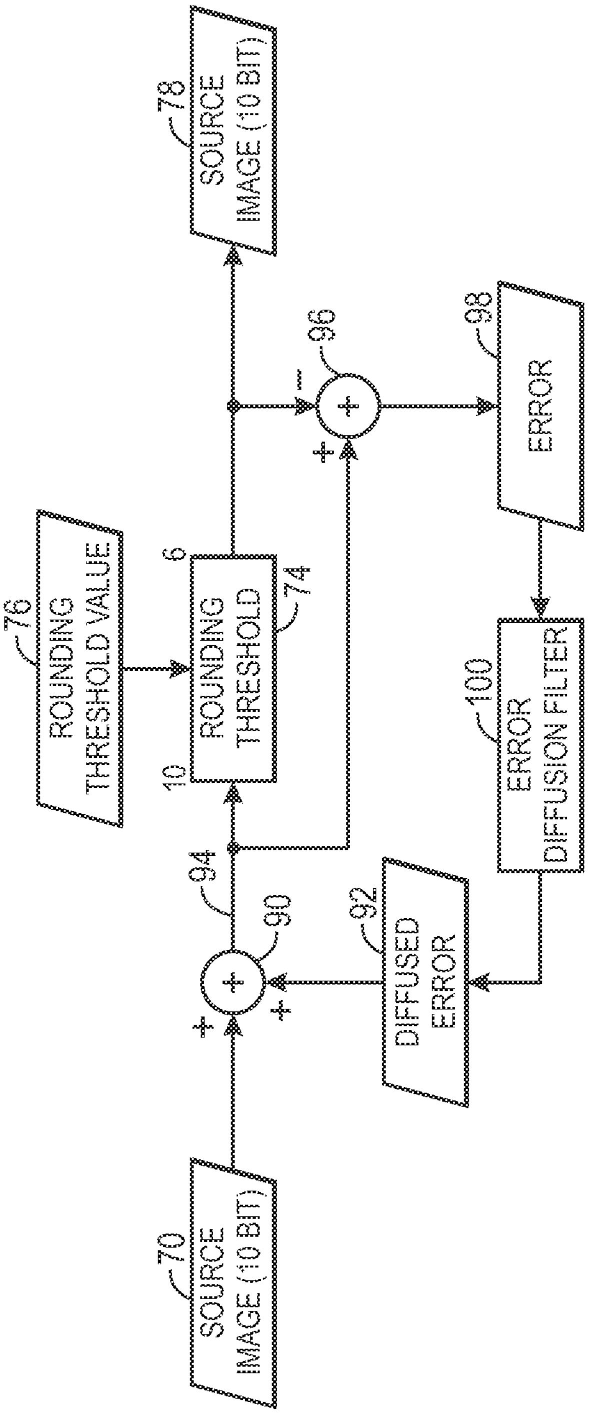
FIG. 6 is a schematic block diagram of a dithering component of the image processing component of FIG. 5, in accordance with an embodiment.

The dithering component 72 appears in greater detail in FIG. 6. As shown in FIG. 6, pixels of the input image data 70, entering at a relatively higher bit-depth (e.g., 10 bits) may be output as a stream of pixels of dithered image data 78 having a relatively lower bit-depth (e.g., 6 bits). The input image data 70 of the relatively higher bit-depth may enter an adder 90, where a diffused error value 92 may be added to produce an initial pixel value 94. As will be discussed further below with reference to FIGS. 7-9, the diffused error value 92 represents image information that has been diffused to the incoming input image data 70 from previous pixels processed by the dithering component 72. This initial pixel value 94 enters the rounding threshold component 74 of the dithering component 72, which may remove some number of least significant bits of the initial pixel value 94 represents not only the original input image data 70 but also some diffused error value 92 that may have been added to or subtracted from the pixel from other pixels in the course of dithering, as will be discussed further below (e.g., as discussed with reference to FIGS. 7-9). The rounding threshold component 74 may keep only some of the most significant bits of the initial pixel value 94 (e.g., the six most significant bits), rounding this value up or down by one based on the rounding threshold value 76. Specifically, the rounding threshold component 74 may round these most significant bits up or down depending on whether the least significant bits (e.g., the four least significant bits) of the initial pixel value 94 are above, below, or equal to the rounding threshold value 76. Examples of how the rounding threshold component 74 may operate appear in FIGS. 10-13, and will be described in greater detail below.

The most significant bits (e.g., the six most significant bits) of the initial pixel value 94 that are rounded up or down by the rounding threshold component 74 may be output as the lower bit-depth dithered image data 78 (e.g., 6-bit image data). This dithered image data 78 may not only be output to the display 18, but also may be used to determine an error signal that will be distributed to other nearby pixels. Specifically, the dithered image data 78 may be subtracted from the initial pixel value 94 in a comparator 96 to produce an error value 98. This error value 98 represents an amount of image data precision that has been removed from the initial pixel value 94 after passing through the rounding threshold component 74. To conserve this information, the error value 98 may be diffused to other nearby pixels using an error diffusion filter component 100. The error diffusion filter component 100 may output the diffused error 92 to the appropriate input image data 70 as it arrives in the dithering component 72.

Figure 7:
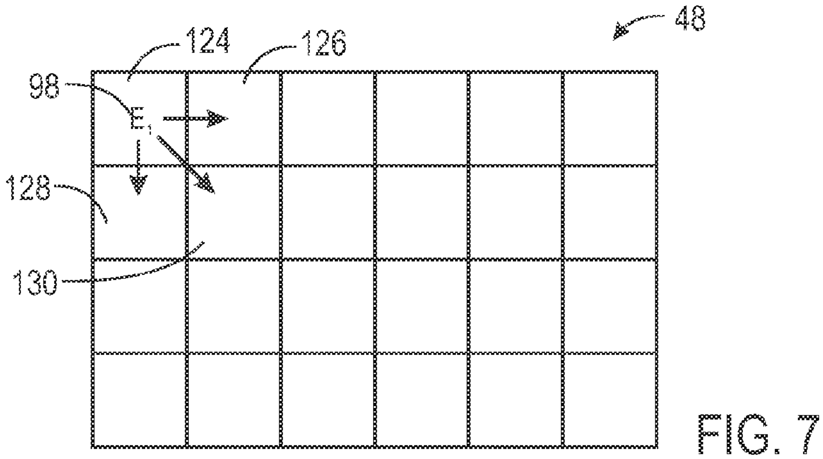
FIGS. 7-9 are schematic illustrations representing various ways the dithering component of FIG. 6 may distribute pixel information from a dithered pixel to other pixels of the M×N pixel array, in accordance with embodiments.
Figure 8:
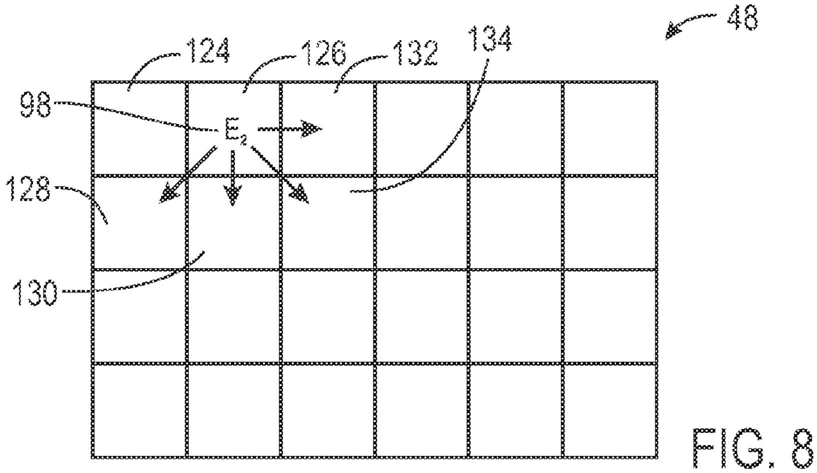
Figure 9:
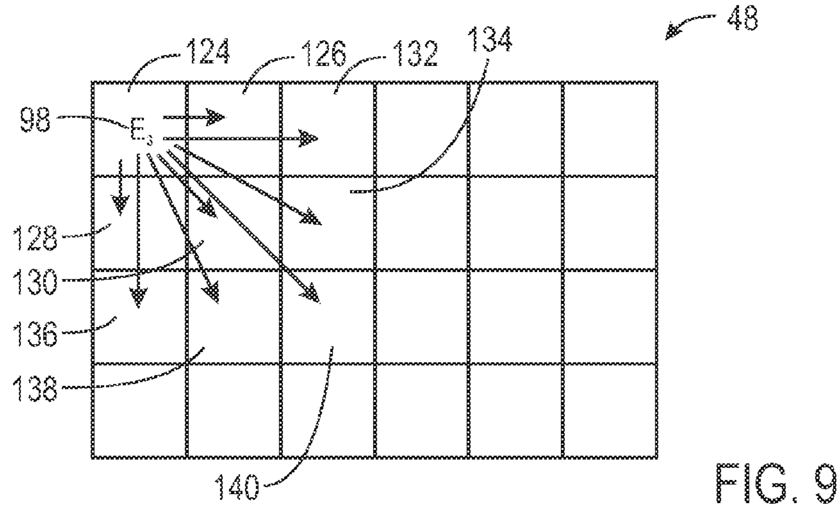

The error diffusion filter component 100 shown in FIG. 6 generally may ensure that pixel precision information remains conserved in the dithered image data 78 by distributing the error value 98 to several nearby pixels, as generally represented in FIGS. 7-9. Turning to FIG. 7, the figure illustrates an embodiment of error diffusion where a color error $E_1$ is diffused to neighboring pixels of the M×N matrix 48. In the illustrated embodiment, a pixel 124 may have been processed by the dithering component 72 such that dithered image data 78 and an error value 98, shown as an error signal $E_1$. This error signal $E_1$ may be distributed to the neighboring pixels 126, 128, and 130, as illustrated in FIG. 7, via the error diffusion filter 100 (shown in FIG. 6). In certain embodiments, the error signal $E_1$ is divided by the number of neighboring pixels 126, 128, and 130 and the result is proportionally distributed among the neighboring pixels. In the illustrated embodiment, each neighboring pixel 126, 128, and 130 would receive one third (i.e., $E_1/3$) of the error signal.

In another embodiment, the error signal $E_1$ may be divided so that one or more neighboring pixels 126, 128, and 130 receive different proportions of the error. For example, half the error signal (i.e., $E_1/2$) may be added to the pixel 126, and one quarter of the error signal (i.e., $E_1/4$) may be added to the neighboring pixels 128 and 130. Assuming raster-order processing, such a disproportionate subdivision passes a larger proportion of the error to the neighboring pixel next in line to enter the dithering component 72 as input image data 70. Once the error signal $E_1$ is diffused, the next image area 82 (e.g., pixel) may be processed, as described in more detail with respect to FIG. 8 below. In other embodiments, other proportions of the error signal $E_1$ may be distributed to nearby pixels of the N×M pixel array 48.

FIG. 8 illustrates the pixel 126 of the M×N matrix 48 undergoing error diffusion. The pixel 126 is represented to have been processed by the dithering component 72 into dithered image data 78 and an error value 98, shown as an error signal $E_2$. The error signal $E_2$ may then be dispersed to the neighboring pixels 128, 130, 132, and 134, as illustrated. The error signal $E_2$ may be processed in the same manner as described above with respect to the error signal $E_1$ of FIG. 7, or may be processed according to another manner. For example, $\frac{7}{16}$ of the error signal $E_2$ may be distributed to the pixel 132, $\frac{1}{16}$ of the error signal $E_2$ may be distributed to the pixel 128, $\frac{5}{16}$ of the error signal $E_2$ may be distributed to the pixel 130, and $\frac{3}{16}$ of the error signal $E_2$ may be distributed to the pixel 134. The entire source image data 60 may be similarly processed by, for example, iterating pixel-by-pixel from left to right and from top to bottom of the image.

Turning to FIG. 9, another example of error diffusion is shown. The example of FIG. 9 illustrates an error signal $E_3$, representing the error value 98, being diffused among eight neighboring pixels 126, 128, 130, 132, 134, 136, 138, and 140 of the M×N matrix 48. It is to be understood that in other embodiments, more or less of the adjacent neighboring pixels may be selected for error diffusion. In the depicted embodiment, the error diffusion may be proportional or disproportional. If disproportional, then any suitable divisional proportions may be assigned to the neighboring pixels 126, 128, 130, 132, 134, 136, 138, and 140.

As discussed above with reference to FIG. 6, the value of the error value 98 (e.g., error signal $E_1$) depends upon whether the rounding threshold component 74 rounds the initial input data up or down after removing some of the least significant bits. In particular, the rounding threshold component 74 may round the initial pixel value 94 up or down depending on the rounding threshold value 76. Since the rounding threshold component 74 may be varied periodically, the output of the rounding threshold component 74 may be different for a given initial pixel value 94 at different times.

Figure 10:
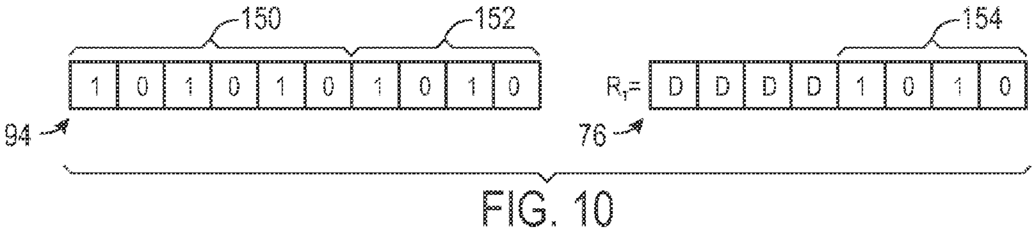
FIGS. 10-13 are schematic diagrams illustrating an effect of varying a rounding threshold value of the dithering component of FIG. 6, in accordance with an embodiment.

FIGS. 10-13 provide an example illustrating how varying the dynamic rounding values 76 may cause the rounding threshold component 74 to output different dithered image data 78 even though the initial pixel value 94 may be the same. As shown in FIG. 10, the initial pixel value 94 may include several most significant bits 150, the number of which are equal to the bit-depth of the dithered image data 78, and several least significant bits 152, which will be removed but reflected in the resulting error value 98. As should be appreciated, the initial pixel value 94 may not always be 10 bits, as illustrated, but rather may be any suitable number of bits that is operated on by data processing circuitry of the electronic device (e.g., the processor(s) 12 and/or the image processing component 20). Thus, in the example of FIGS. 10-13, the initial pixel value 94 has a bit-depth of 10 bits, and the dithered image data 78 has a bit-depth of 6 bits. As such, the most significant bits 150 may be 6 bits and the least significant bits 152 may be 4 bits. The rounding threshold value 76 may represent the rounding threshold employed by the rounding threshold component 74. As illustrated, only 4 bits of the total rounding threshold value 76 may be used to determine whether to round the most significant bits 150 up or down when the least significant bits 152 are removed. For example, the rounding threshold component 74 may round the most significant bits 150 of the initial pixel value 94 down when the least significant bits 152 are less than or equal to some threshold bits 154 of the rounding threshold value 76. It should be noted that the other bits of the rounding threshold value 76 apart from the threshold bits 154 are illustrated as "don't care" bits D, since the value of these bits may not be employed by the rounding threshold component 74.

Figure 11:
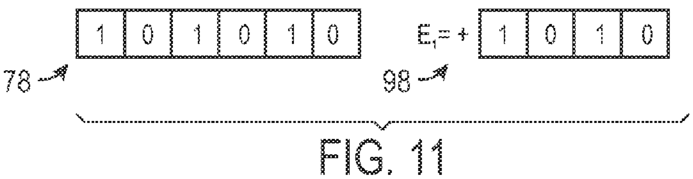

In the example of FIGS. 10 and 11, the value of the least significant bits 152 of the initial input data 94 is less than or equal to the value of threshold bits 154 of the rounding threshold value 76. As such, the most significant bits 150 may be passed on through the rounding threshold component 74 as the dithered image data 78, rounded down. As a result, the error value 98 may be equal to the value of the less significant bits 152, or, in this case, 1010.

Figure 12:
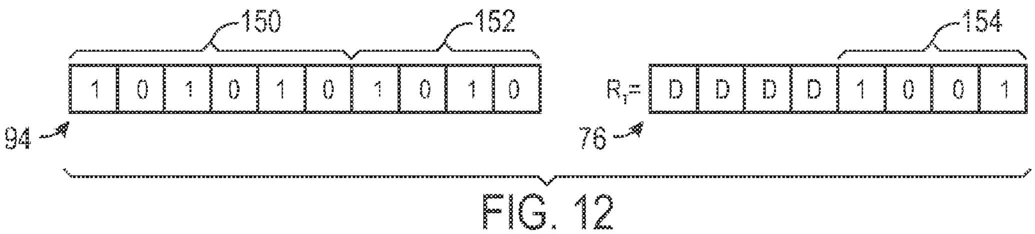
Figure 13:
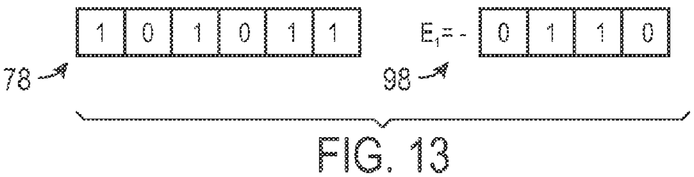

In the example of FIGS. 12 and 13, the initial pixel value 94 is the same as in the example of FIGS. 10 and 11, but the rounding threshold value 76 has changed. In particular, the rounding threshold value 76 has been varied such that, in this case, the least significant bits 152 of the initial pixel value 94 are now greater than the threshold bits 154 of the rounding threshold value 76. As such, the rounding threshold component 74 may round the most significant bits 150 up by one to output the dithered image data 78, as illustrated in FIG. 13. As a result, the error value 98 that is diffused to other pixels of the M×N pixel array 48 is also different, −0110 in this case, causing subsequent initial pixel values 94 also to change. Although varying the rounding threshold value 76 causes certain dithered image data 78 to differ slightly, much of the overall image information will be conserved in other pixels as frames of source image data 60 are processed.

Figure 14:
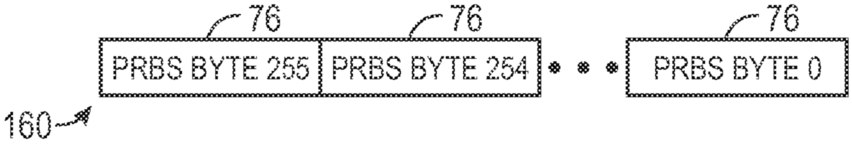
FIG. 14 is a schematic diagram of a sequence of rounding threshold values that may be used by the dithering component of FIG. 6, in accordance with an embodiment.

The rounding threshold selector component 77 may vary the rounding threshold occasionally (e.g., every frame, every other frame, every third frame, or so forth). In one example illustrated by FIG. 14, the rounding threshold selector component 77 may determine a sequence 160 of random or pseudorandom values (e.g., a pseudorandom binary sequence (PRBS)). Thereafter, the rounding threshold selector component 77 may select a new rounding threshold value 76 periodically (e.g., upon receipt of a vertical sync interrupt 64) to provide to the dithering component 72 of the image processing component 20. In the example of FIG. 14, the sequence 160 includes 256 bytes of pseudorandom binary sequence (PRBS) data. The rounding threshold component 74 may programmably receive such one-byte data as the rounding threshold value 76 (only a portion of which may be used as a threshold to round pixel data in the rounding threshold component 74 up or down), but it should be appreciated that in alternative embodiments, rounding threshold values 76 of different sizes may be employed.

Using the sequence 160 illustrated in FIG. 14, in which each of the 256 bytes of the sequence 160 may represent a different value of a pseudorandom binary sequence, all possible threshold values 154 of the rounding threshold values 76 (see FIGS. 10 and 12) may appear at least once, and may appear an equal number of times. For example, when the threshold values 154 represent four bits of a byte-sized rounding threshold value 76, each possible threshold value 154 may appear 16 times, pseudorandomly, throughout the sequence 160. In other embodiments, the sequence 160 may alternatively include any other multiple of all possible integer threshold values 154 (e.g., 16 rounding threshold values 76 throughout which all 16 of O-bit threshold values 154 may be distributed). In some embodiments, the sequence 160 of rounding threshold values 76 may be a predetermined sequence that is stored, for example, in a lookup table (LUT). Alternatively, rather than selecting a next rounding threshold value 76 of the sequence 160, the rounding threshold value selector component 77 may instead determine and provide some random or pseudorandom value to the rounding threshold component 74 of the dithering component 72 on a periodic basis (e.g., on a frame-by-frame basis).

Figure 15:
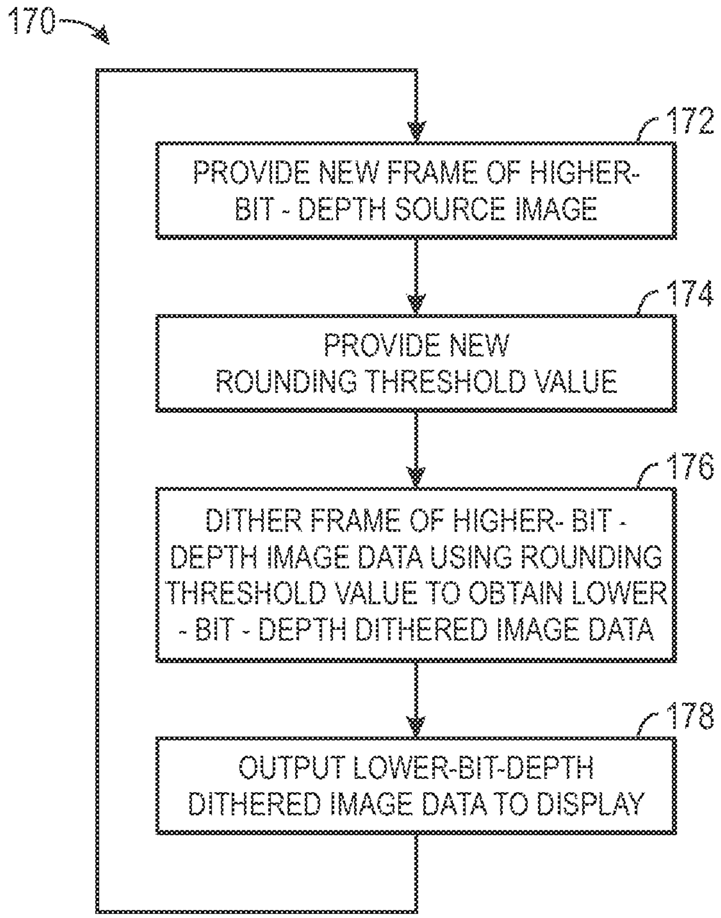
FIG. 15 is a flowchart describing an embodiment of a method for performing dynamic dithering.

As mentioned above, the electronic device 10 may perform such dynamic dithering by varying the rounding threshold value 76 supplied to the image processing component 20 on a periodic basis. For example, in the flowchart 170 of FIG. 15, the image data may be dithered using a different rounding threshold value 76 on a frame-by-frame basis. The flowchart 170 may begin when a new frame of higher-bit-depth source image data is provided to the image processing component 20 of the electronic device (block 172). When the image processing component 20 receives the new frame of source image data 60, the image processing component 20 may output a vertical sync interrupt 64. In response, the rounding threshold value selector component 77 (e.g., a driver associated with the image processing component 20) may provide a new dynamic rounding value 76 to the dithering component 72 of the image processing component 20 (block 174). By way of example, the rounding threshold value selector component 77 may provide a next rounding threshold value 76 in a sequence 160 of rounding threshold values 76 that it has previously determined.

Thereafter, the dithering component 72 may dither the input pixel data 70 using the rounding threshold value 76 to obtain dithered image data 78 (block 176). This lower bit-depth dithered image data 78 then may be output to be displayed on the display 18 (block 178). When a new frame of lower-bit-depth source image data 60 is provided to the image processing component 20 and a new dynamic rounding value is also supplied (block 174). It should be appreciated that when the method of the flowchart 170 is carried out over all of the possible combinations of the threshold values 154 of the rounding threshold values 76, even though all of the frames of source image data 60 may remain the same, all possible combinations of dithering such source image data 60 may occur in a balanced fashion.

Technical effects of the present disclosure include a manner of dynamic dithering of higher-bit-depth image data into lower-bit-depth image data that may be more pleasing to users than traditional spatial dithering. By performing the dynamic dithering techniques disclosed herein, an electronic device may use an electronic display with lower-bit-depth display capabilities without sacrificing the user experience. Such a lower-bit-depth display may be less costly, allowing for lower-priced electronic devices.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

What is claimed is:

1. An electronic device comprising:

image processing circuitry configured to dither a plurality of frames of image data of a first bit-depth based at least in part on a respective plurality of different rounding threshold values to obtain dithered image data of a second bit-depth, wherein the second bit-depth is lower than the first bit-depth; and a display panel configured to display the dithered image data of the second bit-depth.

2. The electronic device of claim 1, wherein the image processing circuitry is configured to dither the plurality of frames of image data based at least in part on the respective plurality of rounding threshold values, wherein the plurality of rounding threshold values comprises a plurality of random or pseudorandom values.

3. The electronic device of claim 1, wherein the image processing circuitry is configured to dither the plurality of frames of image data based at least in part on the respective plurality of rounding threshold values, wherein each of the plurality of rounding threshold values comprises all possible integer rounding threshold values.

4. The electronic device of claim 1, wherein the image processing circuitry is configured to dither each of the plurality of frames of image data based at least in part on different respective rounding threshold values, wherein each of the different respective rounding threshold values comprises one of a multiple of all possible integer rounding threshold values and the plurality of frames of image data comprises a corresponding number of frames of image data.

5. The electronic device of claim 1, comprising data processing circuitry configured to provide the plurality of frames of image data and the plurality of rounding threshold values.

6. The electronic device of claim 5, wherein the data processing circuitry is configured to provide a new one of the plurality of rounding threshold values to the image processing circuitry each time a new one of the plurality of frames of image data is provided to the image processing circuitry.

7. An electronic device comprising:

a dithering component configured to dither a plurality of pixels of image data at least in part by removing one or more least significant bits of an initial pixel value of one of the plurality of pixels to obtain a truncated pixel value, rounding the truncated pixel value up or down based at least in part on whether the one or more least significant bits of the initial pixel value represent a value greater than, equal to, or less than a rounding threshold value to obtain a rounded pixel value, and distributing a difference between the rounded pixel value and the initial pixel value to one or more pixels of the plurality of pixels; and a rounding threshold value selection component configured to determine the rounding threshold value by selecting a first one of a plurality of different rounding threshold values when the dithering component dithers a first frame of image data and a second one of the plurality of rounding threshold values when the dithering component dithers a second frame of image data, wherein the first and second frames of image data are of a first bit-depth and the rounded pixel values are of a second bit-depth.

8. The electronic device of claim 7, wherein the dithering component comprises a component of a hardware image processing pipeline.

9. The electronic device of claim 7, wherein the dithering component comprises instructions executed by a processor of the electronic device.

10. The electronic device of claim 7, wherein the rounding threshold value selection component comprises instructions executed by a processor of the electronic device.

11. The electronic device of claim 7, wherein the rounding threshold value selection component comprises a component of a hardware image processing pipeline.

12. The electronic device of claim 7, wherein the rounding threshold value selection component is configured to determine a different respective rounding threshold value each time the dithering component dithers a new frame of image data.

13. The electronic device of claim 7, wherein the rounding threshold value selection component is configured to determine a different rounding threshold value each multiple of times the dithering component dithers a new frame of image data, wherein the multiple is two or higher.

14. An article of manufacture comprising:

one or more tangible, non-transitory, machine-readable media at least collectively storing instructions executable by a processor of an electronic device, the instructions comprising:

instructions to determine a plurality of rounding threshold values;

instructions to receive a vertical sync interrupt when image processing circuitry of the electronic device receives a new frame of image data and on receipt of the vertical sync interrupt, instructions to provide one of the plurality of rounding threshold values to the image processing circuitry to enable the image processing circuitry to dither new frame of image data from a higher bit-depth into a lower bit-depth based at least in part on the one of the plurality of rounding threshold values, wherein the instructions to determine the plurality of rounding threshold values comprise instructions to determine a sequence of values configured, when provided to the image processing circuitry in sequential order, to cause the image processing circuitry to dither the new frame of image data in a different way from a previous identical frame of image data.

15. The article of manufacture of claim 14, wherein the instructions to determine the plurality of rounding threshold values comprise instructions to determine a plurality of values that comprises all possible rounding threshold values or a multiple of all possible rounding threshold values that can be used by the image processing circuitry to dither the new frame of image data.

16. The article of manufacture of claim 14, wherein the instructions to determine the plurality of rounding threshold values comprise instructions to determine a plurality of random or pseudorandom values.

17. The article of manufacture of claim 14, wherein the instructions to determine the plurality of rounding threshold values comprise instructions to determine a random or pseudorandom sequence of values and wherein the instructions to provide one of the plurality of rounding threshold values to the image processing circuitry comprise instructions to provide a next value of the random or pseudorandom sequence of values to the image processing circuitry.

18. A method comprising:

receiving a first frame of image data of a first bit-depth into an image processing component of an electronic device;

receiving a first rounding threshold value into the image processing component;

dithering the first frame of image data using the image processing component based at least in part on the first rounding threshold value to obtain first dithered image data;

displaying the first dithered image data on an electronic display of the electronic device;

receiving a second frame of image data of the first bit-depth into the image processing component;

receiving a second rounding threshold value into the image processing component, wherein the second rounding threshold value is higher or lower than the first rounding threshold value;

dithering the second frame of image data using the image processing component based at least in part on the second rounding threshold value to obtain second dithered image data; and displaying the second dithered image data on the electronic display of the electronic device.

19. The method of claim 18, wherein the first rounding threshold value and the second rounding threshold value represent different respective values from a pseudorandom binary sequence.

20. The method of claim 18 wherein the second frame of image data is received after the first frame of image data is dithered and before any other frame of image data is received.

21. The method of claim 18, wherein the first frame of image data and the second frame of image data are identical but the first dithered image data and the second dithered image data are different.

22. The method of claim 18, comprising receiving a third frame of image data after dithering the first frame of image data and dithering the third from of image data based at least in part on the first rounding threshold value.

* * * * *